United States Patent [19]

Wilson

[11] Patent Number: 4,745,304
[45] Date of Patent: May 17, 1988

[54] TEMPERATURE COMPENSATION FOR ECL CIRCUITS

[75] Inventor: Stanley Wilson, Sunnyvale, Calif.

[73] Assignee: Advanced Micro Devices, Inc., Sunnyvale, Calif.

[21] Appl. No.: 730,709

[22] Filed: May 3, 1985

[51] Int. Cl.[4] .................... H03K 19/086; H03K 3/01; H03K 3/26
[52] U.S. Cl. ................... 307/455; 307/310; 307/317 A; 307/296 R
[58] Field of Search .......... 307/455, 467, 310, 317 A, 307/297

[56] References Cited

U.S. PATENT DOCUMENTS

| | | | |
|---|---|---|---|
| 3,579,272 | 5/1971 | Foss | 307/455 |
| 3,806,736 | 4/1974 | Wilhelm | 307/455 |
| 3,946,246 | 3/1976 | Marley | 307/455 |
| 3,970,876 | 7/1976 | Allen et al. | 307/455 |
| 4,249,091 | 2/1981 | Yamagiwa | 307/317 A |

Primary Examiner—Stanley D. Miller
Assistant Examiner—B. P. Davis
Attorney, Agent, or Firm—Patrick T. King; Warren M. Becker; J. Vincent Tortolano

[57] ABSTRACT

An ECL circuit comprising an output transistor having a high output voltage VOH guard band and a low output voltage VOL guard band with a temperature compensating network coupled to the output transistor for causing the high level output voltage VOH and low level output voltage VOL of the output transistor to remain within the maximum and minimum limits of the VOH and VOL guard bands over a wide temperature range.

5 Claims, 2 Drawing Sheets

TEMPERATURE COMPENSATION FOR ECL CIRCUITS

BACKGROUND OF THE INVENTION

1. Field of the Invention

The present invention relates to ECL circuits in general and to a method and apparatus to compensate for the negative temperature coefficient of the $V_{BE}$ of an unbiased ECL output transistor in particular.

2. Description of Prior Art

Typically, the potential on the output, i.e. emitter, of an unbiased ECL output transistor is designed to switch between a high output potential VOH of −0.8 volts and a low output potential VOL of −1.6 volts. However, in actual practice, both the VOH and the VOL may be higher or lower depending on the operating temperature. For example, as the temperature of the output transistor increases, the $V_{BE}$ of the transistor decreases causing both VOH and VOL to increase for a given signal potential applied to the base thereof.

In most circuits, the practical maximum and minimum allowable limits of both VOH and VOL, which define VOH and VOL guard bands, respectively, increase linearly with temperature.

When designing an ECL circuit using an unbiased output transistor, the designer attempts to design the output transistor such that its VOH and VOL will not exceed the minimum and maximum VOH and VOL guard band limits. To do this, the designer typically optimizes the design of the output transistor to provide the desired VOH and VOL at the expected normal operational temperature. However, as a practical matter, it is found that the $V_{BE}$ of the output transistor comprises a negative temperature coefficient having a slope which is typically greater than the slope of the guard bands such that at elevated temperatures, e.g. 150° C., VOH and VOL closely approach or exceed the maximum VOH and VOL guard band limits. Conversely, at lower than normal temperatures, VOH and VOL closely approach or exceed the minimum VOH and VOL guard band limits. Such conditions place undesirable constraints on the operational characteristics of the ECL circuit.

SUMMARY OF THE INVENTION

In view of the foregoing, principal objects of the present invention are a method and apparatus comprising an ECL circuit with means for compensating for the negative temperature coefficient of the $V_{BE}$ of an ECL output transistor.

Another object of the present invention is an ECL circuit as described above comprising an output transistor having a maximum and minimum output potential VOH and VOL, respectively, which vary with temperature at a rate closely corresponding to the rate of change as a function of temperature of the maximum and minimum allowable limits of VOH and VOL.

In accordance with the above objects, there is provided a diode, resistor, transistor temperature compensating network coupled to a bias resistor and the base of an output transistor in an ECL circuit.

In operation, the diode drop $V_D$ and the $V_{BE}$ of the transistor change with temperature at a rate such that a change in current in, and voltage drop across the bias resistor compensates for a corresponding change in the $V_{BE}$ of the output transistor with temperature to thereby maintain the maximum and minimum output voltage levels VOH and VOL of the output transistor well within the VOH and VOL guard band limits.

BRIEF DESCRIPTION OF THE DRAWING

The above and other objects, features and advantages of the present invention will become apparent from the following detailed description of the accompanying drawings, in which.

DETAILED DESCRIPTION OF THE DRAWING

Figure 1:
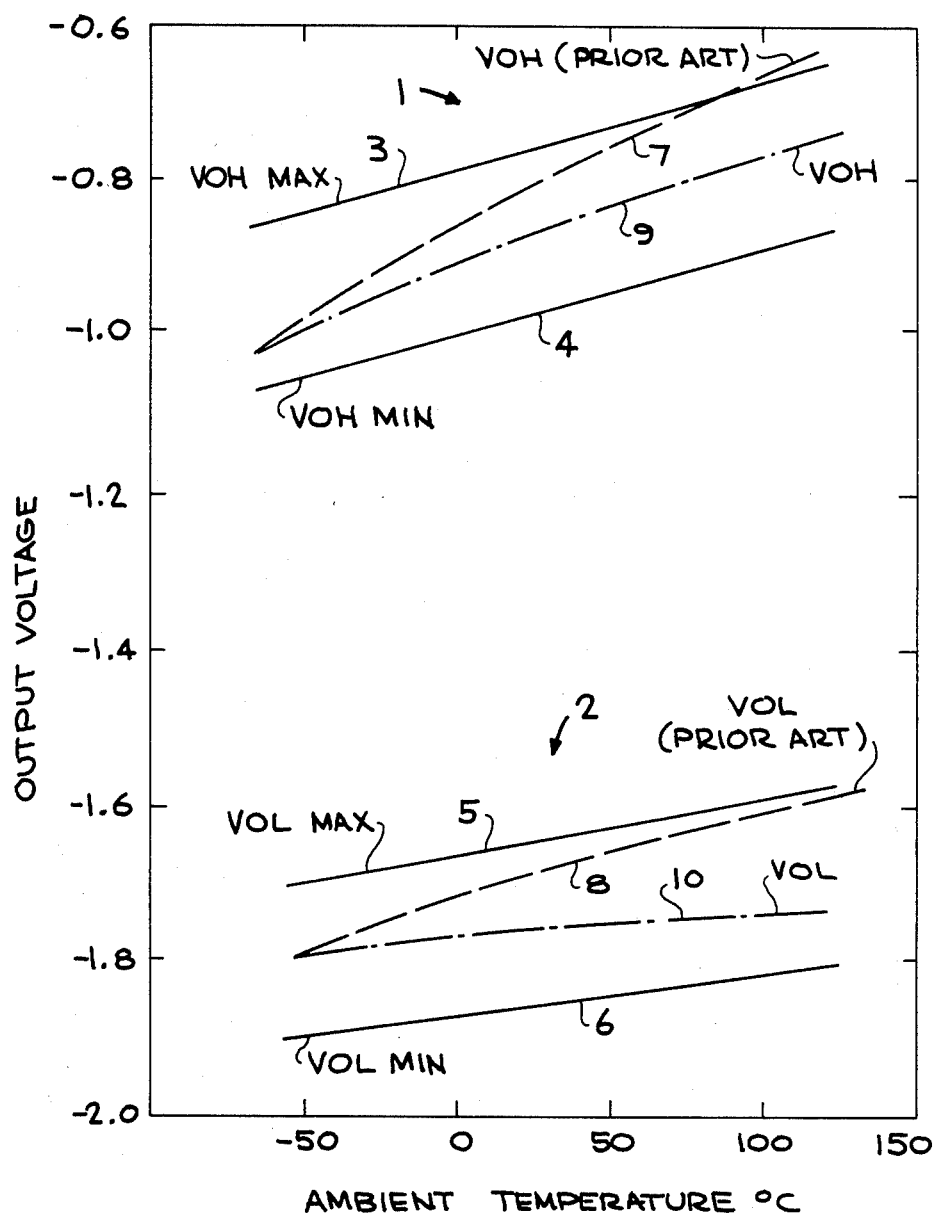
FIG. 1 is a diagram of output voltage versus temperature of a prior art ECL circuit and an ECL circuit according to the present invention.

Referring to FIG. 1, there is represented a high output voltage VOH guard band designated generally as 1 and a low output voltage VOL guard band designated generally as 2. In guard band 1 there is provided a VOH maximum limit 3 and a VOH lower limit 4. In guard band 2 there is provided a VOL maximum limit 5 and a VOL minimum limit 6. The guard bands 1 and 2 increase linearly with temperature and represent the maximum and minimum limits of the output voltage of an ECL circuit.

Within the guard bands 1 and 2 there is shown, by means of dashed lines 7 and 8, the high level and low level output voltages of an unbiased output transistor of a prior art ECL circuit. The dashed lines 7 and 8 shown that the VOH and VOL of an unbiased output transistor of a prior known ECL circuit comprise a slope which is greater than the slope of the guard bands 1 and 2, respectively. These conditions place severe constraints on the operational characteristics of the unbiased output transistors of prior known ECL circuits.

In each of the guard bands there is further shown a dashed-dotted line 9 and 10 which shows the VOH and VOL of an output transistor of an ECL circuit according to the present invention having a slope more closely approximately the slope of the guards bands 1 and 2 and thereby extending the operational temperature characteristics of the prior known ECL circuits.

Figure 2:
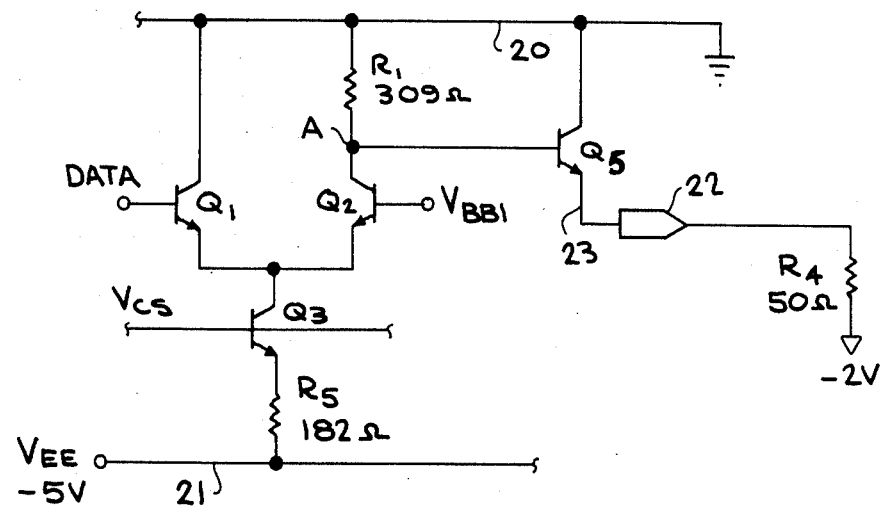
FIG. 2 is a schematic diagram of a prior art ECL circuit.

Referring to FIG. 2, there is provided in a typical prior known ECL circuit a pair of input transistors Q1 and Q2, a current source transistor Q3, an output transistor Q5, a 309 ohm load resistor R1 and a 182 ohm emitter resistor R5.

The transistor Q1 is adapted for receiving a data signal. The transistor Q2 is adapted for receiving a reference voltage $V_{BB1}$. The collector of transistor Q1 is coupled to ground by means of a line 20. The collector of transistor Q2 is coupled to line 20 through resistor R1. The emitters of transistors Q1 and Q2 are coupled to the collector of transistor Q3. The base of transistor Q3 is adapted to be coupled to a source of reference potential $V_{CS}$. The emitter of transistor Q3 is coupled to a negative 5 volt supply by means of the register R5 and a line 21. The base of the transistor Q5 is coupled to a node A located between the resistor R1 and the collector of transistor Q2. The collector of transistor Q5 is coupled to ground by means of the line 20. The emitter of Q5 is coupled to an output pin 22 by means of a line 23. The line 23 is typically terminated by its characteristic impedance, e.g. 50 ohms.

In operation, a reference voltage $V_{CS}$ on the base of the transistor Q3 results in current flowing through transistor Q1 or Q2 for driving the output transistor Q5. As the data on the base of transistor Q1 switches between a high level and a low level, there is provided on the line 23 of the output transistor Q4 a corresponding high level, e.g. −0.8 volts, and low level, e.g. −1.6 volts. The actual voltage levels depend on the temperature of the output transistor Q5 as shown by the dashed lines 7 and 8 in FIG. 1. For example, at normal operating temperatures, e.g. −55° C., the actual high output voltage level VOH and low output voltage level VOL are approximately intermediate the maximum and minimum limits of the VOH and VOL guard bands which define the maximum and minimum limits of the high and low voltage levels. However, as temperature increases to, for example, 150° C., it can be seen that the actual prior art high and low level output voltages approach and may exceed the maximum limits of the high and low output voltage guard bands.

Figure 3:
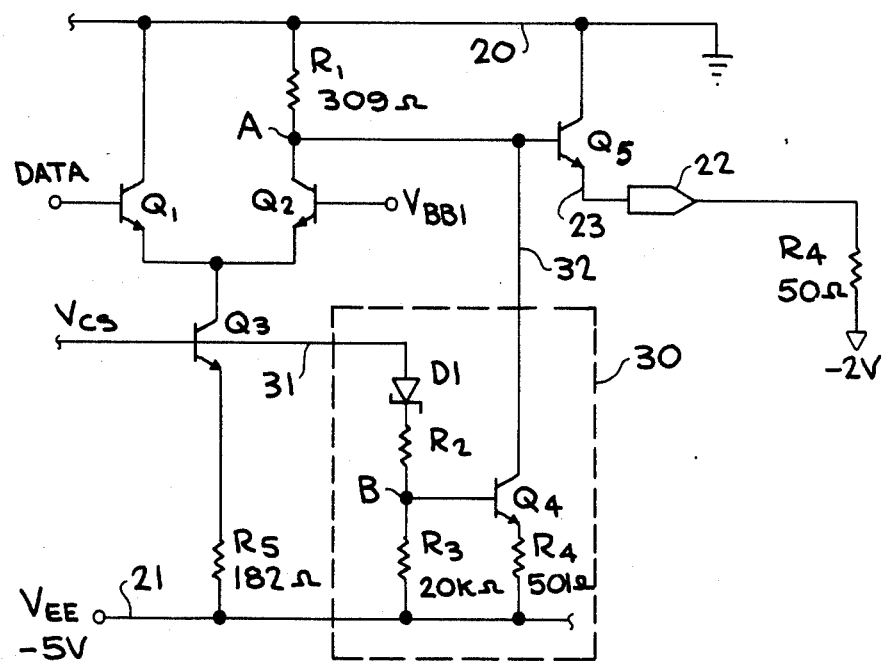
FIG. 3 is a schematic diagram of an ECL circuit according to the present invention.

Referring to FIG. 3, there is provided in accordance with the present invention in addition to the components of the apparatus of FIG. 2, a temperature compensating network 30. For convenience, the components in the circuit of FIG. 3 which are identical to the components in the circuit of FIG. 2, are identified using the same numerical designator.

In the network 30 there is provided a transistor Q4, a diode D1, a resistor R2, a resistor R3 and a resistor R4. The diode D1 is coupled to the source of reference potential $V_{CS}$ by means of a line 31 and to the −5 volt supply by means of the resistors R2 and R3. The base of the transistor Q4 is coupled to a node B located between the resistors R2 and R3. The emitter of transistor Q4 is coupled to the −5 volt supply by means of the resistor R4. The collector of transistor Q5 is coupled to the base of transistor Q4 and node A located between the resistor R1 and the collector of transistor Q2 by means of a line 32. The diode D1 is typically a Schottky diode having a negative temperature coefficient of approximately −1.2 millivolts per degree centigrade. The resistors R1–R5 have typical values of 309, 0, 20K, 501 and 182 ohms, respectively. The transistor Q4 has a $V_{BE}$ with a negative temperature coefficient of approximately −2 millivolts per degree centigrade.

The objective of the present invention is to change the slope of the output voltage versus temperature relationship obtained by the circuit of FIG. 2 to obtain the relationship indicated by the dash-dot lines 9 and 10 of FIG. 1.

What is required to obtain the relationships represented by lines 9 and 10 is an additional current flowing through resistor R1 which is temperature dependent. This current is caused to flow by the action of the collector of transistor Q4, and it is made temperature dependent because of the existence of diode D1.

To understand the operation of D1, R2, R3, Q4, and R4 in circuit 30, it is necessary first to note that the reference potential VCS drives the circuit and that VCS is also temperature dependent. However, it is not necessary to generate VCS for the purposes of this invention since it is generally always available in the presence of ECL logic circuits where it is used for driving the constant current circuits. For example, it causes constant currents to flow in transistor Q3. The value of VCS is defined thus:

$$VCS = V + VBE \tag{1}$$

where VS is the required constant voltage (independent of temperature) across resistor R5 to cause a constant current to flow which is steered either through Q1 or through Q2, depending on the logic state of the DATA. The DATA voltage is either higher than VBB1, in which case Q1 conducts and Q2 is essentially off, or lower than VBB1 in which case Q2 conducts and Q1 is essentially off. The voltage VBB1 is often known as a reference voltage and it determines what is known as the threshold of switching Q1 and Q2. Note in particular that VCS has one component of its value equal to the VBE voltage of a transistor, and this component is therefore also temperature dependent. This component is necessary to compensate for the temperature dependence of transistor Q3 VBE.

We can write an equation as follows:

$$VCS = VD1 + VR2 + VBEQ4 + VR4 \tag{2}$$

where
VD1 is the diode voltage of diode D1
VD2 is the voltage across R2
VBEQ4 is the VBE voltage of transistor Q4
VR4 is the resulting voltage across R4

The value of the voltage across R2 can be written (if we neglect the second order effect of transistor base current) as:

$$VR2 = (VBEQ4 + VR4)R2/R3 \tag{3}$$

Substituting this value for VR2 in Equation 2 and then re-arranging to solve for VR4 we get:

$$VR4 = (VS - VD1 - VBEQ4(R2/R3))/(1 + R2/R3) \tag{4}$$

It is this voltage across R4 which causes the temperature dependent current to flow into the collector of transistor Q4 and via the resistor R1. It can be seen that it is temperature dependent because of the presence in the equation of VD1 and VBEQ4. Also note that the level of the temperature effect is adjustable according to the ratio of R2/R3, which can be selected as necessary. The value of R2 can be made as low as zero ohms. The utilization of a Schottky diode is preferred for D1 since the sum of the voltage VD1 and VBEQ4(R2/R3) must not exceed the value of VS at the minimum temperature at which the onset of current build-up in Q4 is required to begin.

The component values shown in the circuit schematic are for a particular application and may be adjusted as necessary to obtain desired values of VS across R3 and final logic swing voltage across R1.

From FIG. 1 it can be seen that by reducing the slope of the output voltage of the output transistor Q5 as described above, there is obtained a substantial increase in the range of operating temperature for an otherwise conventional ECL circuit.

While an embodiment of the present invention is described above, it is contemplated that various modifications may be made thereto without departing from the spirit and scope of the present invention. Accordingly, it is intended that the embodiment described be only an illustration of the present invention and the scope thereof should not be limited thereto, but be determined by reference to the claims hereinafter provided.

What is claimed is:

1. A temperature compensating bias means for an ECL circuit comprising:
   a first transistor having a base;
   a bias resistor coupled to the base of said first transistor;
   a bias transistor having a collector coupled to said base of said first transistor and said bias resistor, said bias transistor having a base and an emitter; and
   means including a Schottky diode having a negative temperature coefficient coupled between a source of potential $V_{CS}$ and said base of said bias transistor for providing a bias potential $V_x$ on said base of said bias transistor which is a function of $$V_S + V_{BE} - V_{SD}$$

where $V_S$ is a constant potential, $V_{BE}$ is the base-to-emitter potential on said bias transistor and $V_{SD}$ is the voltage drop across said Schottky diode, said bias potential $V_x$ providing an emitter potential $V_E$ on the emitter of said bias transistor which is a function of $$V_x - V_{BE} = V_S - V_{SD}$$

for controlling current flow through said bias resistor such that a change in the potential on said base of said first transistor due to a change in the operating temperature of said ECL circuit is solely a function of the temperature coefficient of said Schottky diode.

2. An ECL circuit according to claim 1 comprising:
   a first resistance for coupling said emitter of said bias transistor to a source of potential $V_{EE}$; and
   a second resistance means for coupling said Schottky diode and said base of said bias transistor to said source of potential $V_{EE}$.

3. An ECL circuit according to claim 2 wherein said first resistance means comprises approximately 500 ohms, said second resistance means comprises approximately 20K ohms and said potential $V_{EE}$ comprises approximately −5.0 volts.

4. A temperature compensating bias means for an ECL circuit comprising:
   a bias resistor coupled to the base of a first transistor;
   a bias transistor having a collector coupled to said base of said first transistor and said bias resistor, said bias transistor having a base and an emitter;
   means including a Schottky diode having a negative temperature coefficient coupled between a source of potential $V_{CS}$ and said base of said bias transistor for providing a bias potential $V_x$ on said base of said bias transistor which is a function of $$V_S + V_{BE} - V_{SD}$$

where $V_S$ is a constant potential, $V_{BE}$ is the base-to-emitter potential on said bias transistor and $V_{SD}$ is the voltage drop across said Schottky diode, said bias potential $V_x$ providing an emitter potential $V_E$ on the emitter of said bias transistor which is a function of $$V_x - V_{BE} = V_S - V_{SD}$$

for controlling current flow through said bias resistor such that a change in the potential on said base of said first transistor due to a change in the operating temperature of said ECL circuit is solely a function of the temperature coefficient of said Schottky diode;
   a first resistance means for coupling said emitter of said bias transistor to a source of potentially $V_{EE}$; and
   a second resistance means for coupling said Schottky diode and said base of said bias transistor to said source of potential $V_{EE}$.

5. An ECL circuit according to claim 4 wherein said first resistance means comprises approximately 500 ohms, said second resistance means comprises approximately 20K ohms and said potential $V_{EE}$ comprises approximately −5.0 volts.

* * * * *